(12) United States Patent
Lee et al.

(10) Patent No.: US 7,560,042 B2
(45) Date of Patent: Jul. 14, 2009

(54) FERROELECTRIC THIN FILM AND DEVICE INCLUDING THE SAME

(75) Inventors: Yong-kyun Lee, Yongin (KR); Young-soo Park, Suwon (KR); June-key Lee, Yongin (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 9 days.

(21) Appl. No.: 11/819,425

(22) Filed: Jun. 27, 2007

(65) Prior Publication Data

US 2008/0237551 A1 Oct. 2, 2008

Related U.S. Application Data

(62) Division of application No. 10/704,745, filed on Nov. 12, 2003, now Pat. No. 7,238,388.

(30) Foreign Application Priority Data

Dec. 24, 2002 (KR) ............................... 2002-83184

(51) Int. Cl.
*H01L 41/18* (2006.01)

(52) U.S. Cl. .................... 252/62.9 R; 252/62.9 PZ; 252/519.54; 106/287.19

(58) Field of Classification Search ............... 252/69, 252/500, 62.9 R, 62.9 PZ, 519.54; 427/266
See application file for complete search history.

(56) References Cited

U.S. PATENT DOCUMENTS

| 4,759,823 | A | | 7/1988 | Asselanis et al. | |
|---|---|---|---|---|---|
| 5,028,455 | A | * | 7/1991 | Miller et al. | 427/126.3 |
| 5,721,009 | A | | 2/1998 | Dougherty et al. | |
| 6,120,846 | A | * | 9/2000 | Hintermaier et al. | 427/269 |
| 7,205,256 | B2 | | 4/2007 | Kimija et al. | |
| 2002/0115307 | A1 | | 8/2002 | Lee et al. | |

FOREIGN PATENT DOCUMENTS

| EP | 1 338 555 A1 | 8/2003 |
|---|---|---|
| WO | WO 02-32809 | 4/2002 |

OTHER PUBLICATIONS

Kijima, Takeshi, et al., "Ultra-thin Ferroelectric Films Modified by Bi2SiO5", Ferroelectrics, vol. 271, pp. 289-295 (Jun. 15, 2002).
Kijima, et al, "Effect of High-Pressure Oxygen Annealing on Bi2SiO5—Added Ferroelectric Thin Films", Jpn. J. Appl. Phys. 41 (Pt. 2, No. 10B):L1164-L1166 (2002).
Kijima, et al., "Si-Substituted Ultrathin Ferroelectric Films", Jpn. J. Appl. Phys. 41 (Pt. 2, No. 6B):L-716-L719 (2002).
McGraw Hill Encyclopedia of Science and Technology, vol. 16, pp. 649-651 (1997).

* cited by examiner

*Primary Examiner*—Douglas Mc Ginty
*Assistant Examiner*—Haidung D Nguyen
(74) *Attorney, Agent, or Firm*—Harness, Dickey & Pierce, P.L.C.

(57) ABSTRACT

A composition for forming a ferroelectric thin film includes: a PZT sol-gel solution including at least one of: a whole or partial hydrolysate of a lead precursor and a whole or partial hydrolyzed and polycondensated product thereof; a whole or partial hydrolysate of a zirconium precursor, a whole or partial hydrolyzed and polycondensated product thereof, and a zirconium complex having at least one hydroxy ion and at least one non-hydrolyzable ligand; a whole or partial hydrolysate of a titanium precursor, a whole or partial hydrolyzed and polycondensated product thereof, and a titanium complex having at least one hydroxyl ion and at least one non-hydrolyzable ligand; and a $Bi_2SiO_5$ sol-gel solution including at least one of: a whole or partial hydrolysate of a silicon precursor and a whole or partial hydrolyzed and polycondensated product thereof, and a resultant obtained by refluxing triphenyl bismuth as a bismuth precursor.

30 Claims, 7 Drawing Sheets

FERROELECTRIC THIN FILM AND DEVICE INCLUDING THE SAME

CROSS REFERENCE TO RELATED APPLICATION

This is a divisional application based on application Ser. No. 10/704,745, filed Nov. 12, 2003 now U.S. Pat. No. 7,238,388, the entire contents of which is hereby incorporated by reference.

BACKGROUND OF THE INVENTION

1. Field of the Invention

The present invention relates to a ferroelectric thin film and a method for forming the same. More particularly, the present invention relates to a ferroelectric thin film suitable for electronic devices such as integrated, non-volatile memory devices, and a method for forming the same using a sol-gel process.

2. Description of the Related Art

A ferroelectric memory device works based on the ferroelectric properties of a ferroelectric thin film and has the structure of a non-volatile memory which does not require back-up power. Ferroelectric materials for ferroelectric memory devices are required to have a high residual polarization and a low coercive field. Furthermore, in addition to a low leakage current in order to obtain good electric properties, the polarization fatigue caused by periodic polarization switching must be reduced. With respect to reduction of a core voltage and high integration, ferroelectric thin films are required to have a thickness of less than several hundreds of nanometers.

A ferroelectric material mainly used for ferroelectric memory devices is lead zirconate titanate (PZT), which has a high residual polarization in a bulk state. Recently, an oxide material of a catalyst material containing one or more selected from Si, Ge, and Sn in PZT was developed.

Figure 1:
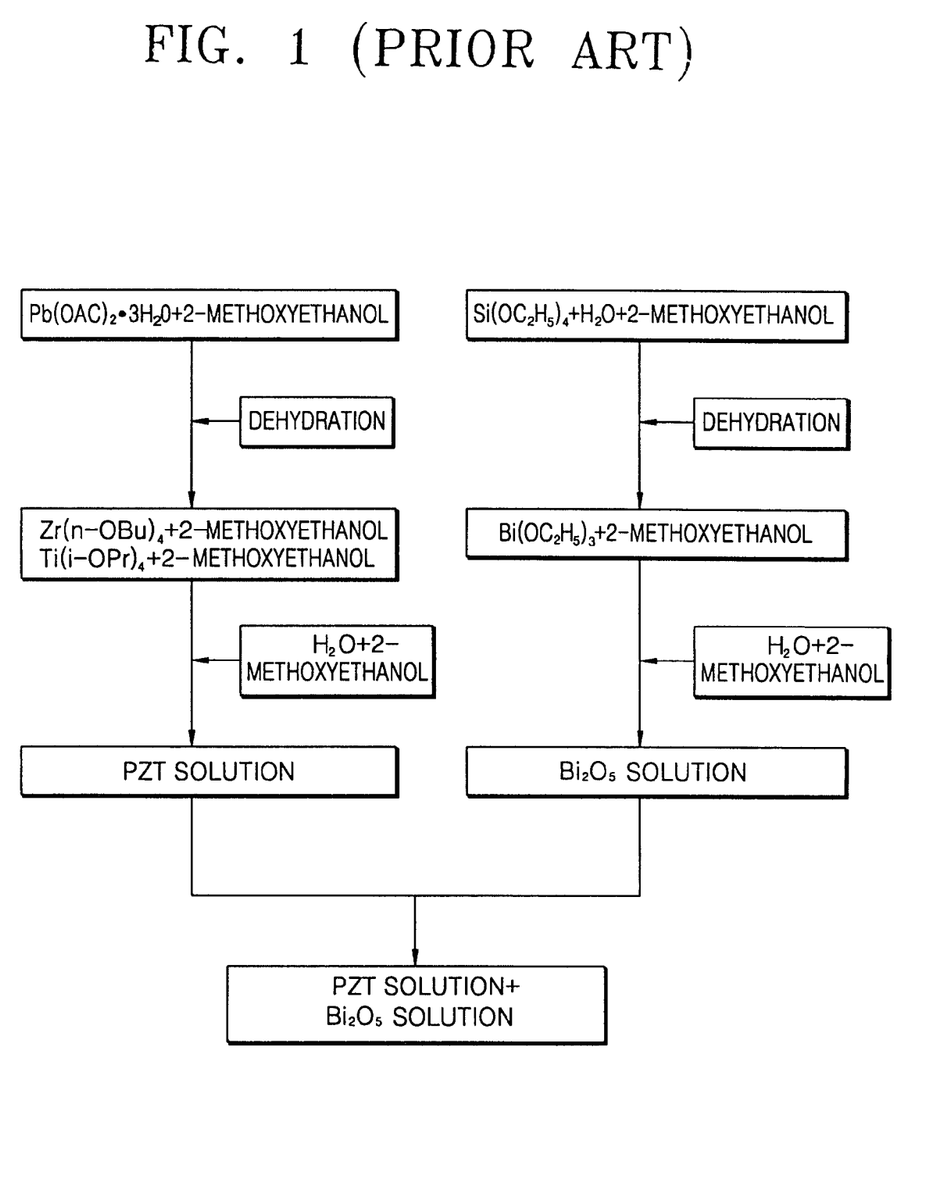
FIG. 1 is a flow diagram of a conventional process for forming a ferroelectric thin film.

A PZT thin film may be formed by a sol-gel process as shown in FIG. 1. However, the composition, i.e., a mixture of a PZT solution and a $Bi_2SiO_5$ solution for forming an oxide thin film as shown in FIG. 1, has very poor storage stability. In addition, an oxide thin film formed by coating and heat treatment of the composition restricts the selection of an electrode to be formed under the oxide thin film. For these reasons, such a PZT thin film is not currently used.

SUMMARY OF THE INVENTION

The present invention provides a composition for forming a ferroelectric thin film with enhanced storage stability under a sol-gel process.

The present invention also provides a method for forming a ferroelectric thin film using the composition for forming a ferroelectric thin film under a sol-gel process.

The present invention also provides a ferroelectric thin film with improved electric properties employing the ferroelectric thin film.

The present invention also provides an electronic device with an enhanced degree of integration.

According to a feature of an embodiment of the present invention, there is provided a composition for forming a ferroelectric thin film including a PZT sol-gel solution and a $Bi_2SiO_5$ sol-gel solution. The PZT sol-gel solution includes at least one of whole or partial hydrolysate of a lead (Pb) precursor and whole or partial hydrolyzed and polycondensated product of the Pb precursor; at least one of whole or partial hydrolysate of a zirconium (Zr) precursor, whole or partial hydrolyzed and polycondensated product of the Zr precursor, and a Zr complex having at least one hydroxy ion and at least one non-hydrolyzable ligand; and at least one of whole or partial hydrolysate of a titanium (Ti) precursor, whole or partial hydrolyzed and polycondensated product of the Ti precursor, and a Ti complex having at least one hydroxyl ion and at least one non-hydrolyzable ligand. The $Bi_2SiO_5$ sol-gel solution comprises at least one of whole or partial hydrolysate of a silicon (Si) precursor and whole or partial hydrolyzed and polycondensated product of the Si precursor; and a resultant product obtained by refluxing triphenyl bismuth $Bi(Ph)_3$ or $Bi(tmhd)_3$ as a bismuth (Bi) precursor, where tmhd is 2,2,6,6-tetramethylheptane-3,5-dionate, and $C_1$-$C_{10}$ alkoxyalcohol.

In the composition, the molar ratio of the PZT sol-gel solution to the $Bi_2SiO_5$ sol-gel solution preferably ranges from about 1:0.0001 to about 1:0.5. The $C_1$-$C_{10}$ alkoxyalcohol preferably includes at least one selected from the group consisting of 2-methoxyethanol, propanol, and acetylacetone. The PZT sol-gel solution preferably further includes at least one selected from the group consisting of whole or partial hydrolysate of a lanthanum (La) precursor and whole or partial hydrolyzed and polycondensated product of the La precursor. The lanthanum precursor is preferably lanthanum acetate. The Pb precursor is preferably PbO or $Pb(OAc)_2 \cdot 3H_2O$, where OAc is $—OC(=O)CH_3$. The Ti precursor is preferably one or more selected from the group consisting of $Ti(i-OPr)_4$, $Ti(i-OPr)_2(acac)_2$, $Ti(OBu)_4$, $Ti(OEt)_2(i-OPr)_2$, and $Ti(OEt)_4$, where i-OPr is isopropoxy, acac is acetylacetonate, OBu is butoxy, and OEt is ethoxy. The Zr precursor is preferably one or more selected from the group consisting of $Zr(i-OPr)_4$, $Zr(OBu)_4$, $Zr(OEt)_2(i-OPr)_2$, $Zr(OEt)_2(acac)_2$, and $Zr(OEt)_4$. The Si precursor is preferably one or more selected from the group consisting of tetraethylorthosilicate (TEOS) and tetraethylsilane.

According to another feature of an embodiment of the present invention, there is provided a ferroelectric thin film obtained by coating and heating the aforementioned composition. The heating preferably includes baking a coated film at a temperature of 100 to 450° C. in air and annealing the baked film at a temperature of 450 to 700° C. in an oxygen atmosphere. The thin film may include a solid solution of $Bi_2SiO_5$ and lead zirconate titanate (PZT) as represented by formula 1:

$$Pb(Zr_xTi_{1-x})O_3 \qquad (1),$$

where x is 0.001 to 1. The thin film may alternatively include a solid solution of $Bi_2SiO_5$ and lanthanum-containing lead zirconate titanate (PLZT) as represented by formula 2:

$$Pb_{1-y}La_y(Zr_xTi_{1-x})_{1-y/4}O_3 \qquad (2),$$

where x is 0.001 to 1 and y is 0.0001 to 1.

According to another feature of an embodiment of the present invention, there is provided a method for forming a ferroelectric thin film including: (a) dissolving a Pb precursor in a solvent to prepare a Pb precursor solution; (b) stabilizing a Zr precursor and a Ti precursor to prepare a Zr precursor solution and a Ti precursor solution; (c) mixing the Pb precursor solution of (a) with the Zr precursor solution and the Ti precursor solution of (b) to obtain a mixture of the Pb precursor solution, the Zr precursor solution, and the Ti precursor solution; (d) dissolving $Bi(Ph)_3$ or $Bi(tmhd)_3$ in $C_1$-$C_{10}$ alkoxyalcohol and refluxing the resultant solution to prepare a Bi precursor solution; (e) dissolving a Si precursor in a solvent to prepare a Si precursor solution and mixing the Si precursor solution with the Bi precursor solution of (d) to obtain a mixture of the Bi precursor solution and the Si precursor solution; (f) mixing the mixture of the Bi precursor solution and the Si precursor solution of (e) with the mixture of the Pb precursor solution, the Zr precursor solution, and the Ti precursor solution of (c), and then hydrolyzing the resultant to obtain a composition for forming a ferroelectric thin film; and (g) coating the composition of (f) on a substrate and heating the coated film.

In this method, in (b), the Ti precursor is preferably one or more selected from the group consisting of $Ti(i-OPr)_4$, $Ti(i-OPr)_2(acac)_2$, $Ti(OBu)_4$, $Ti(OEt)_2(i-OPr)_2$, and $Ti(OEt)4$.

According to another feature of an embodiment of the present invention, there is provided a method for forming a ferroelectric thin film including: (a) dissolving a Pb precursor to prepare a Pb precursor solution; (b) stabilizing a Zr precursor and a Ti precursor to prepare a Zr precursor solution and a Ti precursor solution; (c) mixing the Pb precursor solution of (a) with the Zr precursor solution and the Ti precursor solution of (b) to obtain a mixture of the Pb precursor solution, the Zr precursor solution, and the Ti precursor solution; (d) hydrolyzing the mixture of step (c) to prepare a PZT sol-gel solution; (e) dissolving $Bi(Ph)_3$ or $Bi(tmhd)_3$ in $C_1$-$C_{10}$ alkoxyalcohol and refluxing the resultant solution to prepare a Bi precursor solution; (f) dissolving a Si precursor in alcohol to prepare a Si precursor solution and mixing the Si precursor solution with the Bi precursor solution of (e) to obtain a mixture of the Bi precursor solution and the Si precursor solution; (g) mixing the mixture of the Bi precursor solution and the Si precursor solution of step (f) with the PZT sol-gel solution of (d) to obtain a composition for forming a ferroelectric thin film; and (h) coating the composition of (g) on a substrate and heating the coated film.

In this method, in (b), the Ti precursor is preferably one or more selected from the group consisting of $Ti(i-OPr)_4$, $Ti(i-OPr)_2(acac)_2$, $Ti(OBu)_4$, $Ti(OEt)_2(i-OPr)_2$, and $Ti(OEt)_4$.

In both methods for forming a ferroelectric thin film above, the $C_1$-$C_{10}$ alkoxyalcohol is preferably 2-methoxyethanol. In (a), the Pb precursor is preferably dissolved in one or more solvent selected from the group consisting of acetic acid, n-propanol, 2-methoxyethanol, and acetylacetone. In (a), the Pb precursor is preferably PbO or $Pb(OAc)_2.3H_2O$. In (b), the Zr precursor is preferably at least one selected from the group consisting of $Zr(i-OPr)_4$, $Zr(OBu)_4$, $Zr(OEt)_2(i-OPr)_2$, $Zr(OEt)_2(acac)_2$, and $Zr(OEt)_4$. In (b), the Zr precursor and the Ti precursor are preferably stabilized in one or more selected from the group consisting of acetylacetone, 2-methoxyethanol, n-propanol, and isopropanol. The molar ratio of the PZT sol-gel solution to the mixture of the Bi precursor solution and the Si precursor solution preferably ranges from 1:0.0001 to 1:0.5. The Si precursor is preferably one or more selected from the group consisting of TEOS and tetraethylsilane. The molar concentration of the composition for forming a ferroelectric thin film is preferably in a range of about 0.001 to 2 M.

The methods may further include adding a lanthanum precursor solution to the mixture of (c). The lanthanum precursor is preferably lanthanum acetate.

In the methods, the heating preferably includes baking the coated film at a temperature of 100 to 450° C. in air and annealing the baked film at a temperature of 450 to 700° C. in an oxygen atmosphere.

According to yet another feature of an embodiment of the present invention, there is provided an electronic device using the aforementioned ferroelectric thin film.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Korean Patent Application No. 2002-83184, filed on Dec. 24, 2002, and entitled, "Ferroelectric Thin Film And Method For Forming The Same," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art.

The composition for forming a ferroelectric thin film of the present invention includes a PZT sol-gel solution and a $Bi_2SiO_5$ sol-gel solution. Preferably, the molar ratio of the PZT sol-gel solution and the mixture of the Bi precursor solution and the Si precursor solution ranges from 1:0.0001 to 1:0.5. If the molar ratio is outside this range, physical properties of ferroelectric thin films are lowered. An exemplary solvent for the PZT sol-gel solution and the $Bi_2SiO_5$ sol-gel solution is $C_1$-$C_{10}$ alcohol such as ethyl alcohol, 1-propanol, 2-butanol, and isobutyl alcohol and $C_1$-$C_{10}$ alkoxyalcohol such as 2-methoxyethanol.

Preferably, the molar concentration of the composition for forming a ferroelectric thin film ranges from about 0.001 to 2 M. If the molar concentration is less than 0.001 M, it is difficult to form a thin film. On the other hand, if the molar concentration exceeds 2 M, a homogeneous composition is not easily obtained.

The PZT sol-gel solution includes at least one of a whole or partial hydrolysate of a lead (Pb) precursor and a whole or partial hydrolyzed and polycondensated product of the Pb precursor; at least one of a whole or partial hydrolysate of a Zr precursor, a whole or partial hydrolyzed and polycondensated product of the Zr precursor, and a Zr complex having hydroxy ion and non-hydrolyzable ligand; and at least one of a whole or partial hydrolysate of a Ti precursor, a whole or partial hydrolyzed and polycondensated product of the Ti precursor, and a Ti complex at least one hydroxy ion and at least one non-hydrolyzable ligand.

The Pb precursor is PbO or Pb(OAc)$_2$·3H$_2$O and the Zr precursor is Zr(i-OPr)$_4$, Zr(OBu)$_4$, Zr(OEt)$_2$(i-OPr)$_2$, Zr(OEt)$_2$(acac)$_2$, or Zr(OEt)$_4$ where OAc is —OC(=O)CH$_3$, i-OPr is isopropoxy, OBu is butoxy, OEt is ethoxy, and acac is acetylacetonate. The Ti precursor is one or more selected from the group consisting of Ti(i-OPr)$_4$, Ti(i-OPr)$_2$(acac)$_2$, Ti(OBu)$_4$, Ti(OEt)$_2$(i-OPr)$_2$, and Ti(OEt)$_4$.

The Ti complex is a titanium compound coordinated with at least one hydroxyl ion and at least one non-hydrolyzable ligand. The non-hydrolyzable ligand may be an anion derived from alcohol, carboxylic acid, diketone, β-keto ester, or β-imino ketone. An exemplary non-hydrolyzable ligand is acetylacetonate (acac).

Examples of the Ti complex include Ti(OH)$_2$(acac)$_2$, Ti(OH)(acac)$_3$, and Ti(OH)$_{2-a}$(i-OPr)$_a$(acac)$_2$ (where 0<a≦2). Ti(OH)$_2$(acac)$_2$ may be prepared as follows: titanium tetraalkoxide such as Ti(i-OPr)$_4$ and acetyl acetone (about 1:2, molar ratio) react with each other in an organic solvent to form a Ti(i-OPr)$_2$(acac)$_2$ solution. Then, water and/or an acidic catalyst are/is added to the resultant solution and heated until isopropoxy is completely hydrolyzed to obtain Ti(OH)$_2$(acac)$_2$. If the hydrolysis is incompletely carried out, Ti(OH)$_{2-a}$(i-OPr)$_a$(acac)$_2$ is formed.

The Zr complex has the same ligand as in the aforementioned Ti complex. The illustrative examples and preparation method of the aforementioned Ti complex are similarly applicable to the Zr complex.

The Bi$_2$SiO$_5$ sol-gel solution includes at least one of a whole or partial hydrolysate of a Si precursor and a whole or partial hydrolyzed and polycondensated product of a Si precursor, and a resultant product obtained by refluxing triphenyl bismuth Bi(Ph)$_3$ or Bi(tmhd)$_3$ as a Bi precursor, and C$_1$-C$_{10}$ alkoxyalcohol. The alkoxyalcohol may be, e.g., 2-methoxyethanol. During refluxing, all or part of the ligands of the Bi precursor are replaced with alkoxyalcohol.

The Si precursor may be tetraethylorthosilicate (TEOS) or tetraethylsilane.

Hereinafter, a method for forming a ferroelectric thin film of the present invention will be described in detail with reference to the accompanying drawings.

Figure 2:
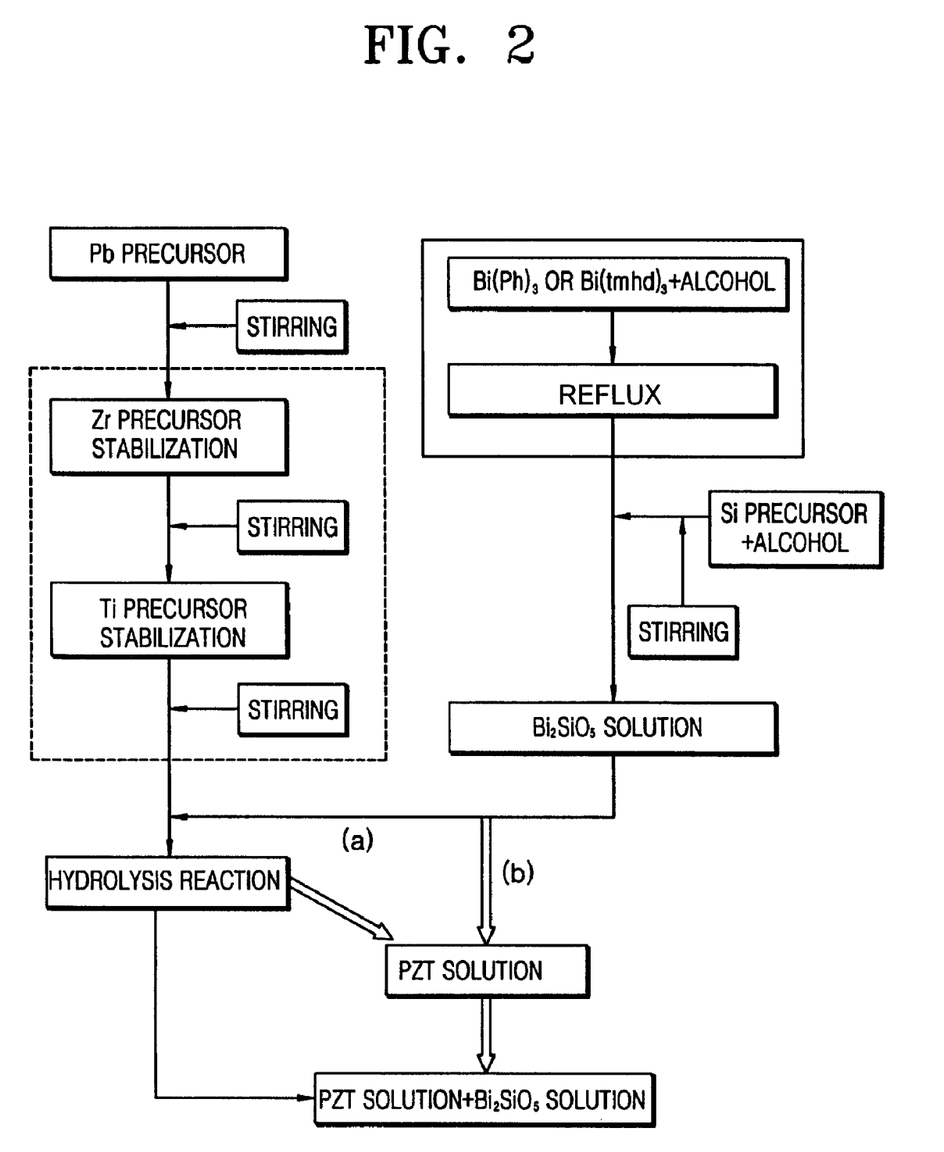
FIG. 2 is a flow diagram of a process for forming a ferroelectric thin film according to the present invention.

FIG. 2 is a flow diagram of a process for forming a ferroelectric thin film according to an embodiment of the present invention.

Referring to FIG. 2, first, a Pb precursor is dissolved in one or more solvent selected from the group consisting of acid and alcohol and stirred to prepare a Pb precursor solution. The stirring temperature is 50 to 80° C., and preferably about 70° C. The acid for the Pb precursor solution is a weak acid of pH 4 or more such as acetic acid. Examples of the alcohol include 2-methoxyethanol, n-propanol, 1,3-propanediol, 1,4-butanediol, 1,2-propanediol, and ethylene glycol. The content of the solvent is adjusted so that the concentration of the Pb precursor solution is in a range of 0.001 to 2 M.

Then, each of a Zr precursor and a Ti precursor is mixed with an organic compound such as acetylacetone, 2-methoxyethanol, and propanol, and stirred to stabilize the precursors. For the Zr precursor, a solution of the above organic compound in an alcoholic solvent such as n-propanol and isopropylalcohol may be added to the Zr precursor to adjust reactivity of a ligand substitution reaction of the Zr precursor. The content of the organic compound is adjusted so that the concentration of each of the Zr precursor solution and the Ti precursor solution is in a range of about 0.0001 to 2 M.

When acetylacetone is used as the organic compound, acetylacetone is substituted for all or part of the ligands of each of the Zr precursor and the Ti precursor. On the other hand, when alcohol such as 2-methoxyethanol is used as the organic compound, the ligand substitution reaction does not occur.

There is no particular limitation to the stirring temperature. However, it is preferable to carry out the stirring process at room temperature.

The stabilized Zr precursor solution and the Ti precursor solution are mixed with the Pb precursor solution and stirred to prepare a mixture.

Meanwhile, a Bi precursor such as Bi(Ph)$_3$ and Bi(tmhd)$_3$ is dissolved in C$_1$-C$_{10}$ alkoxyalcohol and refluxed to prepare a Bi precursor solution. During refluxing, the Bi precursor wholly or partially undergoes a ligand substitution reaction. The content of the alkoxyalcohol is adjusted so that the concentration of the Bi precursor solution is between about 0.0001 and 2 M. If the content of the alkoxyalcohol is outside this range, a reactivity of a ligand substitution reaction of the Bi precursor is poor.

A Si precursor is dissolved in alcohol and stirred at room temperature to prepare a Si precursor solution. The Si precursor solution is mixed with the Bi precursor solution to obtain a mixture of the Bi precursor solution and the Si precursor solution.

Examples of the alcohol for the Si precursor solution include, e.g., 2-methoxyethanol, methoxymethanol, and propanol. The content of the alcohol is adjusted so that the concentration of the Si precursor solution is in a range of about 0.0001 to 6 M, and preferably 1 to 6 M.

According to (a) shown in FIG. 2, the mixture of the Bi precursor solution and the Si precursor solution is mixed with the mixture including the Zr precursor solution and the Ti precursor solution and hydrolyzed to produce a composition for forming a ferroelectric thin film.

Alternatively, according to (b) shown in FIG. 2, first, the mixture including the Zr precursor solution and the Ti precursor solution is hydrolyzed to prepare a hydrolyzed solution of the PZT sol-gel solution. The mixture of the Bi precursor solution and the Si precursor solution is then added to the hydrolyzed solution of the PZT sol-gel solution to produce a composition for forming a ferroelectric thin film.

The composition for forming a ferroelectric thin film is coated on a substrate and heated. Although there is no particular limitation to the coating method, spin coating may be used.

The heating process includes baking the coated film at a temperature of 100 to 450° C. and annealing the baked thin film at a temperature of 450 to 700° C. under an oxygen atmosphere. When needed, the baking and the annealing processes may be repeated several times. The annealing may be carried out in a furnace or by a rapid thermal process (RTP).

If the baking temperature is less than 100° C., alcohol decomposition does not occur, while if the baking temperature exceeds 450° C., an unwanted secondary phase is formed. On the other hand, if the annealing temperature is less than 450° C., an unwanted phase is formed, while if the annealing temperature exceeds 700° C., production cost increases.

Before the coating process, a PTO (PbTiO$_3$) seed layer may be coated on the substrate. The seed layer provides preferred orientation of the ferroelectric thin film.

FIG. 2 shows that a Zr precursor solution and a Ti precursor solution are sequentially added to a Pb precursor solution that is previously prepared. Without being limited to this process sequence, after a Zr precursor and a Ti precursor are stabilized to obtain respective precursor solutions, a Pb precursor solution may be added to a mixture of the Zr and Ti precursor solutions. Similarly, FIG. 2 shows that a Si precursor solution is added to a previously prepared Bi precursor solution. However, it may be possible to add a Bi precursor solution to a Si precursor that is previously prepared. As mentioned above, a process sequence in the method for forming a ferroelectric thin film of the present invention may be altered, provided that the features of the present invention are accomplished.

Bi$_2$SiO$_5$ acts as a catalyst for facilitating formation of a perovskite or layered perovskite phase, crystal nucleation, and reduction in crystallization energy, during heating for PZT or PLZT crystallization. Once crystal nuclei are formed on the surface of the Bi$_2$SiO$_5$, the Bi$_2$SiO$_5$ no longer acts as a catalyst for nucleation. Subsequently, when a temperature is lowered, the Bi$_2$SiO$_5$ together with perovskite PZT of formula 1 or perovskite PLZT of formula 2 forms a solid solution.

$$Pb(Zr_xTi_{1-x})O_3 \qquad \text{Formula 1:}$$

$$Pb_{1-y}La_y(Zr_xTi_{1-x})_{1-y/4}O_3 \qquad \text{Formula 2:}$$

where, x is 0.001 to 1, in particular 0.01 to 1, and y is 0.0001 to 1.

The ferroelectric thin film of the present invention has a thickness of 1 to 1,000 nm. Therefore, it is suitable for use as a dielectric layer for semiconductor capacitors and a gate dielectric film for transistors. In addition, the ferroelectric thin film of the present invention may be applied to various highly integrated electronic devices. A representative electronic device to which the ferroelectric thin film of the present invention may be applied is a non-volatile memory device such as a ferroelectric random access memory (FRAM) device.

Hereinafter, a preferred embodiment of the present invention will be described with reference to the following preparations and examples but is not limited thereto.

Preparation 1

Pb(OAc)$_2$.3H$_2$O and acetic acid were mixed and stirred at 70° C. to prepare an about 0.15 M solution of a Pb precursor.

An acetylacetonate solution obtained by dissolving acetylacetone in 1,3-propanol was slowly added dropwise to Zr(OBu)$_4$ and stirred at room temperature to prepare a 0.3-0.4 M solution of a Zr precursor.

Acetylacetonate was added dropwise to Ti(i-OPr)$_4$ and stirred at room temperature to prepare a 0.6-0.8 M solution of a Ti precursor.

Meanwhile, Bi(Ph)$_3$ and 2-methoxyethanol were mixed and refluxed to prepare an about 0.00045 M solution of a Bi precursor.

Tetraethylorthosilicate (TEOS) and 2-methoxyethanol were stirred at room temperature. Then, the resultant mixture was mixed with the Bi precursor solution to prepare a mixture of the Bi precursor solution and the Si precursor solution.

The Pb precursor solution, the Zr precursor solution, and the Ti precursor solution were mixed to prepare a mixture of the Pb precursor solution, the Zr precursor solution, and the Ti precursor solution. The mixture of the Pb precursor solution, the Zr precursor solution, and the Ti precursor solution was mixed with the mixture of the Bi precursor solution and the Si precursor solution. Then, the resultant mixture was hydrolyzed to prepare about 0.015 M of a composition for forming a ferroelectric thin film.

Preparation 2

Pb(OAc)$_2$.3H$_2$O and acetic acid were mixed and stirred at 70° C. to prepare an about 0.15 M solution of a Pb precursor.

2-methoxyethanol was added to Zr(OBu)$_4$ and stirred at room temperature to prepare a 0.3-0.4 M solution of a Zr precursor.

2-Methoxyethanol was added dropwise to Ti(i-OPr)$_4$ and stirred at room temperature to prepare a 0.6-0.8 M solution of a Ti precursor.

Meanwhile, Bi(tmhd)$_3$ and 2-methoxyethanol were mixed and refluxed to prepare an about 0.00045 M solution of a Bi precursor.

TEOS and 2-methoxyethanol were stirred at room temperature to prepare a Si precursor solution and then the Si precursor solution was mixed with the Bi precursor solution to prepare a mixture of the Bi precursor solution and the Si precursor solution.

The Pb precursor solution, the Zr precursor solution, and the Ti precursor solution were mixed to prepare a mixture of the Pb precursor solution, the Zr precursor solution, and the Ti precursor solution. The mixture of the Pb precursor solution, the Zr precursor solution, and the Ti precursor solution was mixed with the mixture of the Bi precursor solution and the Si precursor solution. Then, the resultant mixture was hydrolyzed to prepare about 0.015 M of a composition for forming a ferroelectric thin film.

Comparative Preparation 1

Pb(OAc)$_2$.3H$_2$O and 2-methoxyethanol were mixed and dehydrated to prepare a Pb precursor solution.

2-Methoxyethanol was added to Zr(OBu)$_4$ and stirred to prepare a Zr precursor solution. 2-Methoxyethanol was added to Ti(i-OPr)$_4$ and stirred to prepare a Ti precursor solution.

The Pb precursor solution, the Zr precursor solution, and the Ti precursor solution were mixed and hydrolyzed via the addition of water and 2-methoxyethanol to thereby prepare a PZT sol-gel solution.

Meanwhile, TEOS, water, and 2-methoxyethanol were mixed and dehydrated. Then, a mixture of Bi(OC$_2$H$_5$)$_3$ and 2-methoxyethanol was added to the dehydrated mixture. Water and 2-methoxyethanol were then added to the resultant mixture to prepare a Bi$_2$SiO$_5$ sol-gel solution.

The PZT sol-gel solution and the Bi$_2$SiO$_5$ sol-gel solution were mixed to prepare about 0.015 M of a composition for forming a ferroelectric thin film.

EXAMPLE 1

The composition of Preparation 1 was spin coated on a substrate made of Pt(100 nm)/Ti(30 nm)/SiO$_2$(200 nm)/Si. The coated film was baked at about 300-400° C. in air for 10 minutes and annealed by RTP at 500° C. under an oxygen atmosphere for 10 minutes. The baking and annealing were repeated several times to obtain a ferroelectric thin film.

EXAMPLE 2

A PTO (PbTiO$_3$) seed layer was spin coated on the upper surface of a platinum electrode and annealed at 300-450° C. to form a PTO seed layer with a thickness of about 30 nm. Then, the composition of Preparation 2 was spin coated on the seed layer. The coated film was baked at about 300-400° C. in air for 10 minutes and then annealed by RTP at 550-650° C. under an oxygen atmosphere for 10 minutes. The baking and annealing were repeated several times to obtain a ferroelectric thin film.

COMPARATIVE EXAMPLE 1

A ferroelectric thin film was prepared in the same manner as in Example 1 except that the composition of Comparative Preparation 1 was used.

Storage stability of each composition of Preparations 1-2 and Comparative Preparation 1 was evaluated. For this, the compositions were allowed to stand at 25° C. for 2,400 hours to 3 months and then the state of each composition was assessed.

According to the assessment results, the composition of Comparative Preparation 1 was decomposed after 1 to 5 hours. On the other hand, the compositions of Preparations 1 and 2 revealed a stable pattern for about three months.

The ferroelectric thin films of Example 1 and Comparative Example 1 were subjected to both X-ray diffraction (XRD) analysis and scanning electron microscopic (SEM) analysis. The XRD spectra and SEM photographs are shown in FIGS. 3A-3B and 4A-4B, respectively.

Figure 3A:
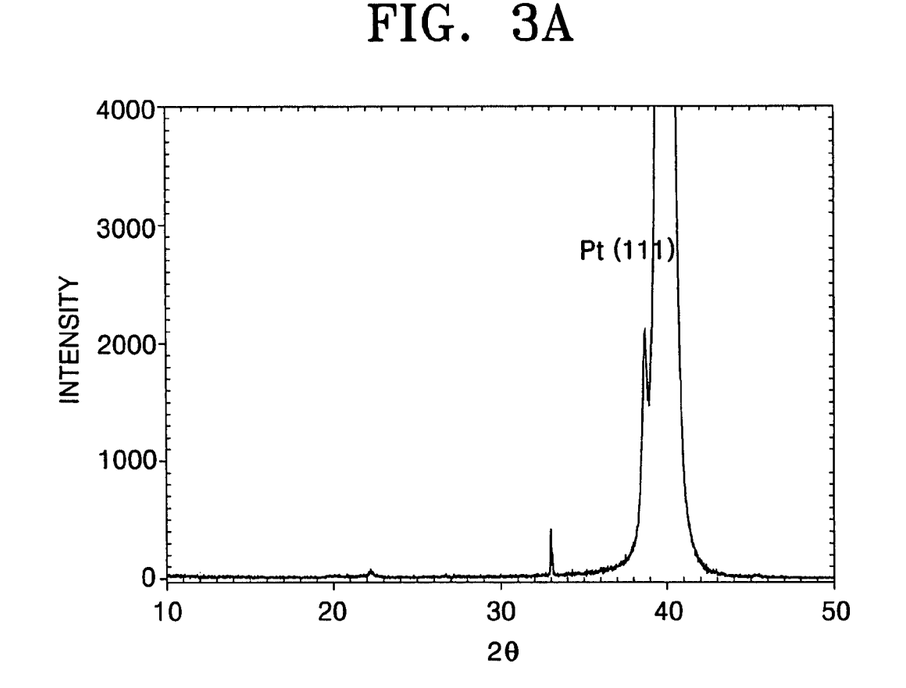
FIGS. 3A and 3B illustrate X-ray diffraction (XRD) spectra of the ferroelectric thin films of an Example 1 and a Comparative Example 1.
Figure 3B:
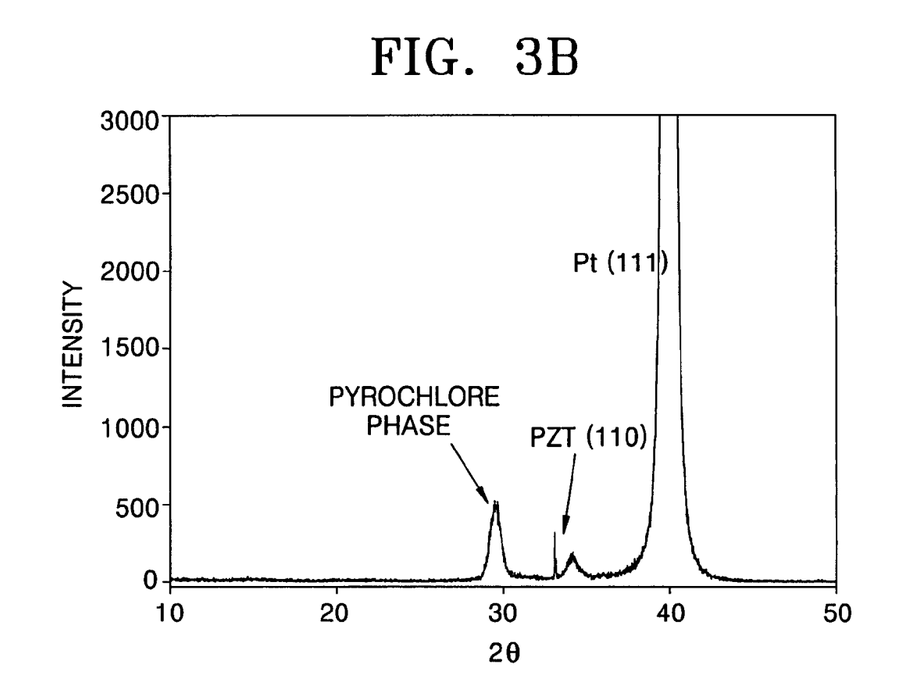
Figure 4A:
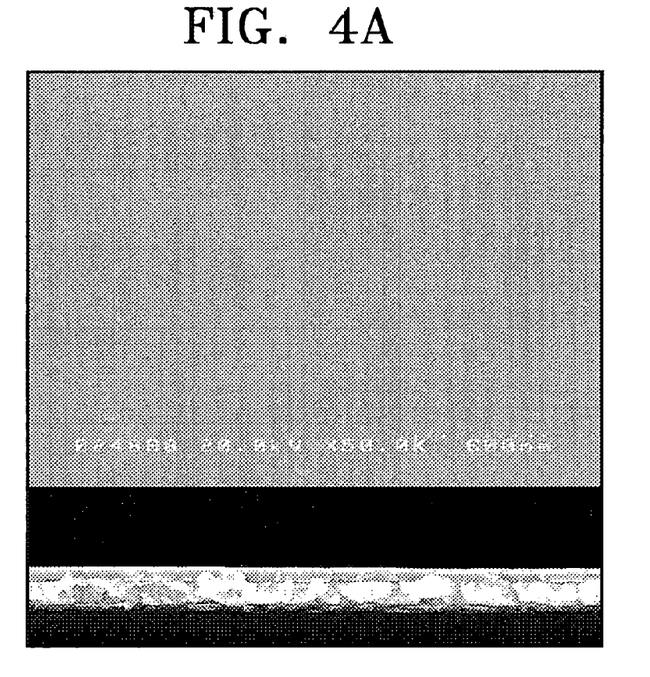
FIGS. 4A and 4B are scanning electron microscopic (SEM) photographs of the ferroelectric thin films of Example 1 and Comparative Example 1.
Figure 4B:
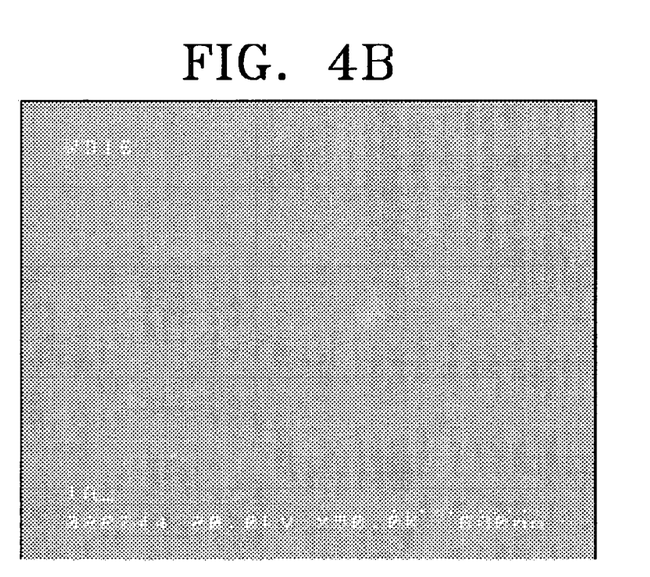

Referring to FIGS. 3B and 4B, which show an XRD spectrum and a SEM photograph of the ferroelectric thin film of Comparative Example 1, a Bi-based pyrochlore phase was mainly present. On the other hand, referring to FIGS. 3A and 4A, which show an XRD spectrum and a SEM photograph of the ferroelectric thin film of Example 1, a Bi based pyrochlore phase was not present. Rather, a PZT perovskite phase was mainly observed. These results demonstrate that the ferroelectric thin film of Example 1 has a very preferable orientation in terms of polarization.

Figure 5:
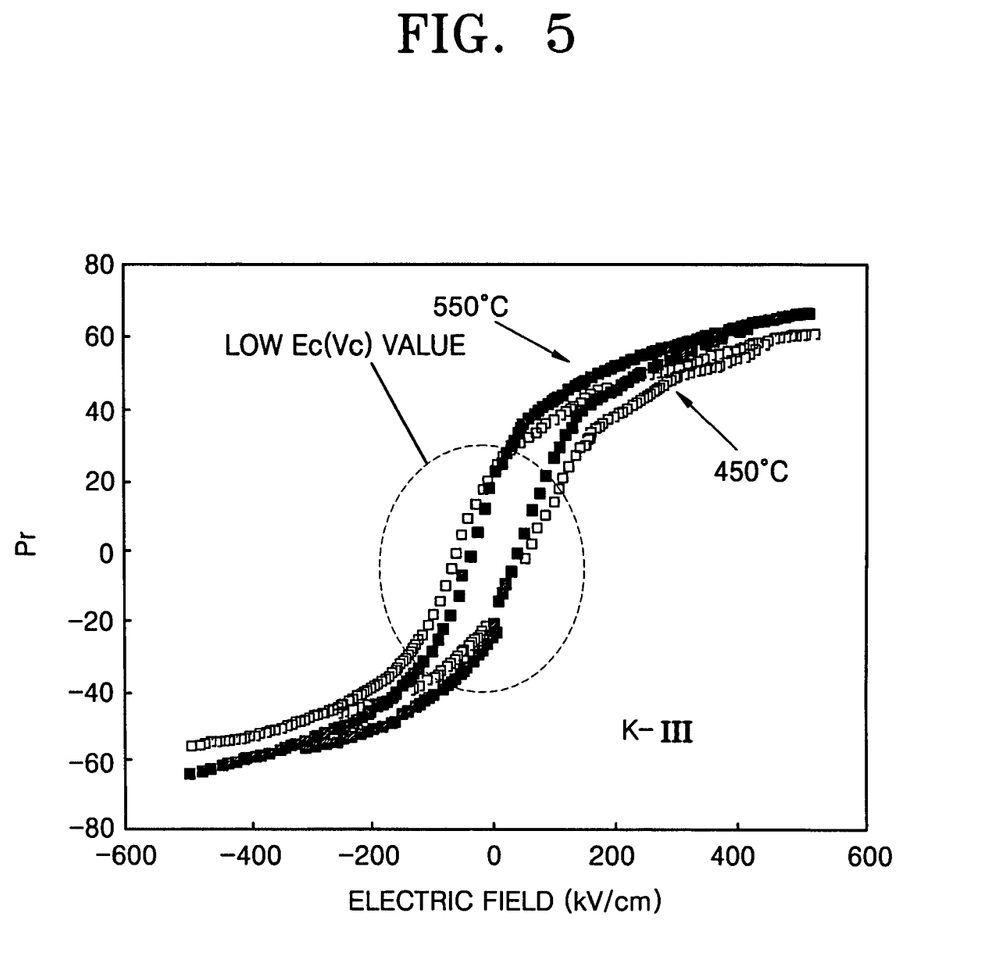
FIG. 5 shows polarization (P)—electric field (E) characteristics of the ferroelectric thin film of an Example 2 according to the present invention.

FIG. 5 shows polarization (Pr)—electric field (kV/cm) characteristics of the ferroelectric thin film of Example 2. As shown in FIG. 5, the ferroelectric thin film of Example 2 exhibited good polarization.

Figure 6:
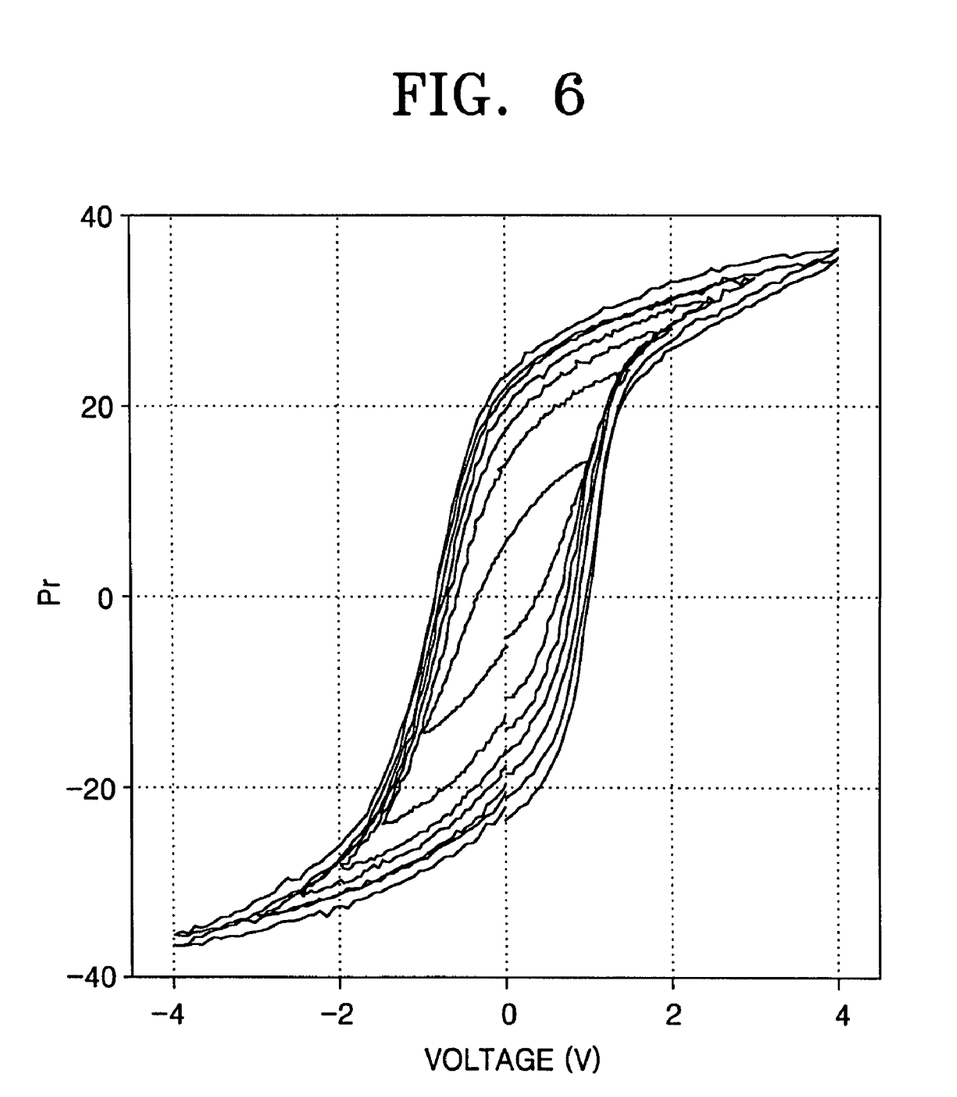
FIG. 6 shows polarization (P)—voltage (V) characteristics of the ferroelectric thin film of Example 2 according to the present invention.

FIG. 6 shows polarization (Pr)—voltage (V) characteristics of the ferroelectric thin film of Example 2. As shown in FIG. 6, the ferroelectric thin film of Example 2 exhibited a good voltage (V) range suitable for a practical process.

In addition, fatigue characteristics of the PZT thin film of Example 2 were evaluated. The fatigue characteristics were investigated by means of standardized ferroelectric test system RT66A at 1 μHz for 10,000 seconds.

Figure 7:
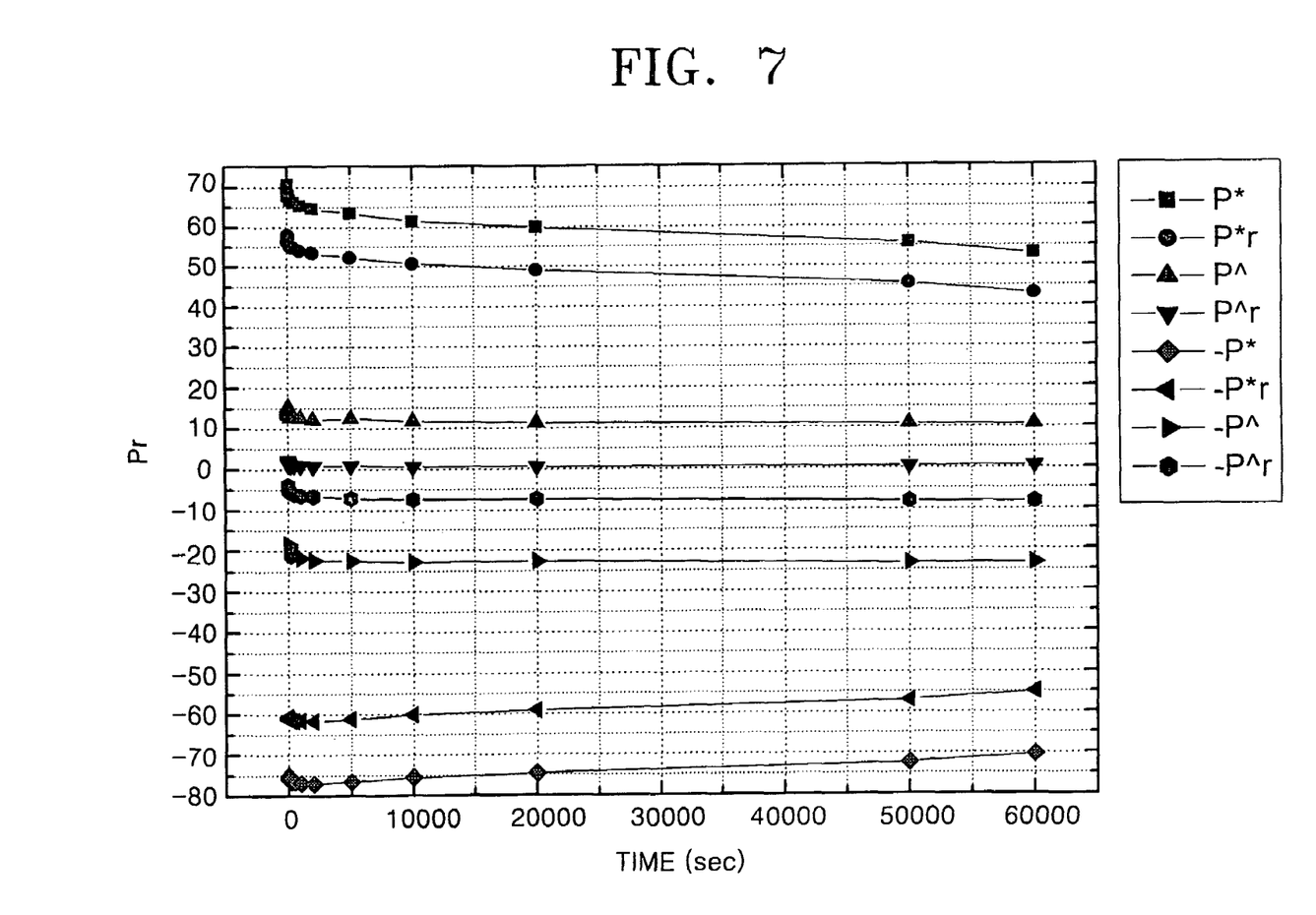
FIG. 7 shows fatigue characteristics of the PZT thin film of Example 2 according to the present invention.

The fatigue characteristics of the PZT thin film of Example 2 are shown in FIG. 7. As shown in FIG. 7, the PZT thin film of Example 2 underwent little fatigue.

As apparent from the above description, the present invention provides a composition for forming a ferroelectric thin film with excellent storage stability and a ferroelectric thin film with excellent electrical properties. In addition, the present invention provides an electronic device, in particular a non-volatile memory device with an enhanced degree of integration.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An electronic device including a ferroelectric thin film, wherein the ferroelectric thin film is formed by a method comprising:
   (a) dissolving a Pb precursor in a solvent to prepare a Pb precursor solution;
   (b) stabilizing a Zr precursor and a Ti precursor to prepare a Zr precursor solution and a Ti precursor solution;
   (c) mixing the Pb precursor solution of (a) with the Zr precursor solution and the Ti precursor solution of (b) to obtain a mixture of the Pb precursor solution, the Zr precursor solution, and the Ti precursor solution;
   (d) dissolving a Bi precursor in a ligand-substitution solvent including one or more of a $C_1$-$C_{10}$ alcohol, a $C_1$-$C_{10}$ alkoxyalcohol, or mixtures thereof, and refluxing the resultant solution to prepare a Bi precursor solution;
   (e) dissolving a Si precursor in a solvent to prepare a Si precursor solution and mixing the Si precursor solution with the Bi precursor solution of (d) to obtain a mixture of the Bi precursor solution and the Si precursor solution, without hydrolyzing the mixture of the Bi precursor solution and the Si precursor solution;
   (f) mixing the unhydrolyzed mixture of the Bi precursor solution and the Si precursor solution of (e) with the mixture of the Pb precursor solution, the Zr precursor solution, and the Ti precursor solution of (c), and then hydrolyzing the resultant to obtain a composition for forming a ferroelectric thin film; and
   (g) coating the composition of (f) on a substrate and heating the coated film.

2. The device as claimed in claim 1, wherein in (d), the Bi precursor includes one or more of $Bi(Ph)_3$, and the solvent includes 2-methoxyethanol.

3. The device as claimed in claim 1, wherein in (a), the Pb precursor is dissolved in one or more of acetic acid, n-propanol, 2-methoxyethanol, or acetylacetone.

4. The device as claimed in claim 1, wherein in (b), the Zr precursor and the Ti precursor are stabilized in one or more of acetylacetone, 2-methoxyethanol, n-propanol, or isopropanol.

5. The device as claimed in claim 1, further comprising adding a lanthanum precursor solution to the mixture of (c).

6. The device as claimed in claim 1, wherein the heating in (g) includes baking the coated composition at a temperature of 100 to 450° C. in air and annealing the baked film at a temperature of 450 to 700° C. under an oxygen atmosphere.

7. The device as claimed in claim 1, wherein the ferroelectric thin film includes a solid solution of $Bi_2SiO_5$ and lead zirconate titanate (PZT) as represented by formula 1:

$$Pb(Zr_xTi_{1-x})O_3 \qquad (1),$$

where x is 0.001 to 1.

8. The device as claimed in claim 5, wherein the ferroelectric thin film includes a solid solution of $Bi_2SiO_5$ and a lanthanum-containing lead zirconate titanate (PLZT) as represented by formula 2:

$$Pb_{1-y}La_y(Zr_xTi_{1-x})_{1-y/4}O_3 \qquad (2),$$

where x is 0.001 to 1 and y is 0.0001 to 1.

9. The electronic device as claimed in claim 1, wherein the composition for forming a ferroelectric thin film has a molar concentration of about 0.001 to about 2 M.

10. An electronic device including a ferroelectric thin film, wherein the ferroelectric thin film is formed by a method comprising:
   (a) dissolving a Pb precursor in a solvent to prepare a Pb precursor solution;
   (b) stabilizing a Zr precursor and a Ti precursor to prepare a Zr precursor solution and a Ti precursor solution;
   (c) mixing the Pb precursor solution of (a) with the Zr precursor solution and the Ti precursor solution of (b) to obtain a mixture of the Pb precursor solution, the Zr precursor solution, and the Ti precursor solution;
   (d) hydrolyzing the mixture of (c) to prepare a PZT sol-gel solution;
   (e) dissolving a Bi precursor in a ligand-substitution solvent including one or more of a $C_1$-$C_{10}$ alcohol, a $C_1$-$C_{10}$ alkoxyalcohol, or mixtures thereof, and refluxing the resultant solution to prepare a Bi precursor solution;
   (f) dissolving a Si precursor in a solvent to prepare a Si precursor solution and mixing the Si precursor solution with the Bi precursor solution of (e) to obtain a mixture of the Bi precursor solution and the Si precursor solution, without hydrolyzing the mixture of the Bi precursor solution and the Si precursor solution; and (g) mixing the unhydrolyzed mixture of the Bi precursor solution and the Si precursor solution of (f) with the PZT sol-gel solution of (d) to obtain a composition for forming a ferroelectric thin film; and (h) coating the composition of (g) on a substrate and heating the coated film.

11. The device as claimed in claim 10, wherein in (e), the Bi precursor includes one or more of Bi(Ph)$_3$ and Bi(tmhd)$_3$, the solvent includes 2-methoxyethanol.

12. The device as claimed in claim 10, wherein in (a), the Pb precursor is dissolved in one or more of acetic acid, n-propanol, 2-methoxyethanol, or acetylacetone.

13. The device as claimed in claim 10, wherein in (b), the Zr precursor and the Ti precursor are stabilized in one or more of acetylacetone, 2-methoxyethanol, n-propanol, or isopropanol.

14. The device as claimed in claim 10, further comprising adding a lanthanum precursor solution to the mixture of (c).

15. The device as claimed in claim 10, wherein the heating in (h) includes:
baking the coated composition at a temperature of 100 to 450° C. in air; and
annealing the baked film at a temperature of 450 to 700° C. under an oxygen atmosphere.

16. The device as claimed in claim 10, wherein the ferroelectric thin film includes a solid solution of Bi$_2$SiO$_5$ and lead zirconate titanate (PZT) as represented by formula 1:

$$Pb(Zr_xTi_{1-x})O_3 \qquad (1),$$

where x is 0.001 to 1.

17. The device as claimed in claim 14, wherein the ferroelectric thin film includes a solid solution of Bi$_2$SiO$_5$ and a lanthanum-containing lead zirconate titanate (PLZT) as represented by formula 2:

$$Pb_{1-y}La_y(Zr_xTi_{1-x})_{1-y/4}O_3 \qquad (2),$$

where x is 0.001 to 1 and y is 0.0001 to 1.

18. The electronic device as claimed in claim 10, wherein the composition for forming a ferroelectric thin film has a molar concentration of about 0.001 to about 2 M.

19. A composition for forming a ferroelectric thin film, wherein the composition is formed by a method comprising:
(a) dissolving a Pb precursor in a solvent to prepare a Pb precursor solution;
(b) stabilizing a Zr precursor and a Ti precursor to prepare a Zr precursor solution and a Ti precursor solution;
(c) mixing the Pb precursor solution of (a) with the Zr precursor solution and the Ti precursor solution of (b) to obtain a mixture of the Pb precursor solution, the Zr precursor solution, and the Ti precursor solution;
(d) dissolving a Bi precursor in a ligand-substitution solvent including one or more of a C$_1$-C$_{10}$ alcohol, a C$_1$-$_{10}$ alkoxyalcohol, or mixtures thereof, and refluxing the resultant solution to prepare a Bi precursor solution;
(e) dissolving a Si precursor in a solvent to prepare a Si precursor solution and mixing the Si precursor solution with the Bi precursor solution of (d) to obtain a mixture of the Bi precursor solution and the Si precursor solution, without hydrolyzing the mixture of the Bi precursor solution and the Si precursor solution; and
(f) mixing the unhydrolyzed mixture of the Bi precursor solution and the Si precursor solution of (e) with the mixture of the Pb precursor solution, the Zr precursor solution, and the Ti precursor solution of (c), and then hydrolyzing the resultant to obtain a composition for forming a ferroelectric thin film.

20. The composition as claimed in claim 19, wherein in (d), the Bi precursor includes one or more of Bi(Ph)$_3$ or Bi(tmhd)$_3$, and the solvent includes 2-methoxyethanol.

21. The composition as claimed in claim 19, wherein in (a), the Pb precursor is dissolved in one or more of acetic acid, n-propanol, 2-methoxyethanol, or acetylacetone.

22. The composition as claimed in claim 19, wherein in (b), the Zr precursor and the Ti precursor are stabilized in one or more of acetylacetone, 2-methoxyethanol, n-propanol, or isopropanol.

23. The composition as claimed in claim 19, further comprising adding a lanthanum precursor solution to the mixture of (c).

24. The composition for forming a ferroelectric thin film as claimed in claim 19, wherein the composition for forming a ferroelectric thin film has a molar concentration of about 0.001 to about 2 M.

25. A composition for forming a ferroelectric thin film, wherein the composition is formed by a method comprising:
(a) dissolving a Pb precursor in a solvent to prepare a Pb precursor solution;
(b) stabilizing a Zr precursor and a Ti precursor to prepare a Zr precursor solution and a Ti precursor solution;
(c) mixing the Pb precursor solution of (a) with the Zr precursor solution and the Ti precursor solution of (b) to obtain a mixture of the Pb precursor solution, the Zr precursor solution, and the Ti precursor solution;
(d) hydrolyzing the mixture of (c) to prepare a PZT sol-gel solution;
(e) dissolving a Bi precursor in a ligand-substitution solvent including one or more of a C$_1$-C$_{10}$ alcohol, a C$_1$-$_{10}$ alkoxyalcohol, and mixtures thereof, and refluxing the resultant solution to prepare a Bi precursor solution;
(f) dissolving a Si precursor in a solvent to prepare a Si precursor solution and mixing the Si precursor solution with the Bi precursor solution of (e) to obtain a mixture of the Bi precursor solution and the Si precursor solution, without hydrolyzing the mixture of the Bi precursor solution and the Si precursor solution; and
(g) mixing the unhydrolyzed mixture of the Bi precursor solution and the Si precursor solution of (f) with the PZT sol-gel solution of (d) to obtain a composition for forming a ferroelectric thin film.

26. The composition as claimed in claim 25, wherein in (e), the Bi precursor includes one or more of Bi(Ph)$_3$ or Bi(tmhd)$_3$, and the solvent includes 2-methoxyethanol.

27. The composition as claimed in claim 25, wherein in (a), the Pb precursor is dissolved in one or more of acetic acid, n-propanol, 2-methoxyethanol, or acetylacetone.

28. The composition as claimed in claim 25, wherein in (b), the Zr precursor and the Ti precursor are stabilized in one or more of acetylacetone, 2-methoxyethanol, n-propanol, or isopropanol.

29. The composition as claimed in claim 25, further comprising adding a lanthanum precursor solution to the mixture of (c).

30. The composition for forming a ferroelectric thin film as claimed in claim 25, wherein the composition for forming a ferroelectric thin film has a molar concentration of about 0.001 to about 2 M.

* * * * *